United States Patent
Fletcher et al.

(10) Patent No.: US 10,481,491 B2
(45) Date of Patent: Nov. 19, 2019

(54) FLUID DROPLET METHODOLOGY AND APPARATUS FOR IMPRINT LITHOGRAPHY

(71) Applicant: CANON KABUSHIKI KAISHA, Tokyo (JP)

(72) Inventors: Edward Brian Fletcher, Austin, TX (US); Timothy Brian Stachowiak, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 187 days.

(21) Appl. No.: 15/375,912

(22) Filed: Dec. 12, 2016

(65) Prior Publication Data

US 2018/0164678 A1 Jun. 14, 2018

(51) Int. Cl.
*G03F 7/00* (2006.01)
*H01L 21/768* (2006.01)
*G06K 15/10* (2006.01)
*B29C 43/02* (2006.01)

(52) U.S. Cl.
CPC ......... *G03F 7/0002* (2013.01); *G06K 15/105* (2013.01); *H01L 21/76817* (2013.01); *B29C 2043/025* (2013.01)

(58) Field of Classification Search
None
See application file for complete search history.

(56) References Cited

U.S. PATENT DOCUMENTS

| 4,216,480 | A * | 8/1980 | Buehner | B41J 2/5056 347/14 |
| 5,788,385 | A * | 8/1998 | Inoue | B41J 2/5056 347/37 |
| 6,164,745 | A * | 12/2000 | Nagoshi | B41J 19/142 347/15 |
| 6,280,023 | B1 * | 8/2001 | Ufkes | B41J 2/085 347/78 |
| 6,402,280 | B2 * | 6/2002 | Kneezel | B41J 2/2125 347/15 |
| 6,527,379 | B1 * | 3/2003 | Martin | B41J 2/02 347/73 |
| 6,783,208 | B2 * | 8/2004 | Kawase | B41J 2/14233 257/E27.001 |

(Continued)

FOREIGN PATENT DOCUMENTS

WO 2013129679 A1 9/2013

*Primary Examiner* — Amar Movva
(74) *Attorney, Agent, or Firm* — Abel Schillinger, LLP

(57) ABSTRACT

A method can be used to generate a fluid droplet pattern for an imprint lithography process using a fluid dispense system having fluid dispense ports. The method can include determining a fluid droplet pattern for dispensing a formable material onto a substrate; during a first pass, dispensing the formable material onto the substrate to form a first part of the fluid droplet pattern for an imprint field; offsetting the fluid dispense ports and substrate relative to each other in an offset direction; and during a second pass, dispensing the formable material onto the substrate to form a second part of the fluid droplet pattern for the imprint field. The method can be used to form a patterned layer over a semiconductor wafer in fabricating an electronic device. An apparatus can be configured to carry out the method.

11 Claims, 7 Drawing Sheets

(56) References Cited

U.S. PATENT DOCUMENTS

| | | | | |
|---|---|---|---|---|
| 6,846,065 B2* | 1/2005 | Otsuki | B41J 19/147 | 347/40 |
| 7,300,127 B2* | 11/2007 | Konno | B41J 2/16585 | 347/13 |
| 8,119,052 B2 | 2/2012 | Schumaker | | |
| 8,512,797 B2 | 8/2013 | Schumaker | | |
| 8,586,126 B2 | 11/2013 | Schumaker | | |
| 9,028,022 B2 | 5/2015 | Kodama et al. | | |
| 9,176,376 B2* | 11/2015 | Mataki | B82Y 10/00 | |
| 2002/0113849 A1* | 8/2002 | Hawkins | B41J 2/03 | 347/77 |
| 2004/0228964 A1* | 11/2004 | Ito | H01L 51/0005 | 427/64 |
| 2006/0051498 A1* | 3/2006 | Katagami | B41J 2/2114 | 427/66 |
| 2007/0035597 A1* | 2/2007 | Ready | B41J 2/2139 | 347/99 |
| 2007/0217075 A1* | 9/2007 | Kamata | B82Y 10/00 | 360/135 |
| 2007/0237886 A1* | 10/2007 | Dijksman | B41J 3/4071 | 427/8 |
| 2007/0278712 A1* | 12/2007 | Okushima | B82Y 10/00 | 264/236 |
| 2008/0018875 A1* | 1/2008 | Schram | B82Y 10/00 | 355/67 |
| 2009/0185018 A9* | 7/2009 | Ready | B41J 2/2139 | 347/99 |
| 2009/0267268 A1* | 10/2009 | Yoneda | B82Y 10/00 | 264/319 |
| 2009/0284570 A1* | 11/2009 | Jung | B41J 2/14274 | 347/71 |
| 2010/0099322 A1* | 4/2010 | Katagami | B41J 3/28 | 445/24 |
| 2010/0101493 A1* | 4/2010 | Hodge | B05B 12/004 | 118/697 |
| 2010/0102471 A1* | 4/2010 | Truskett | B82Y 10/00 | 264/40.7 |
| 2011/0268869 A1* | 11/2011 | Dijksman | B41J 3/4071 | 427/8 |
| 2012/0050441 A1* | 3/2012 | Mikami | B82Y 10/00 | 347/110 |
| 2012/0074605 A1* | 3/2012 | Nakagawa | G03F 7/16 | 264/40.1 |
| 2013/0010020 A1* | 1/2013 | Kodama | B82Y 10/00 | 347/10 |
| 2013/0020281 A1* | 1/2013 | Wakamatsu | B41J 2/2135 | 216/40 |
| 2013/0120485 A1* | 5/2013 | Kodama | B41J 2/04508 | 347/14 |
| 2014/0368568 A1* | 12/2014 | Kodama | B41J 25/003 | 347/9 |
| 2015/0014876 A1 | 1/2015 | Yamashita et al. | | |
| 2015/0014877 A1 | 1/2015 | Yamashita et al. | | |
| 2015/0017329 A1 | 1/2015 | Fletcher et al. | | |
| 2015/0099059 A1* | 4/2015 | Harjee | B41J 2/07 | 427/8 |
| 2017/0355189 A1* | 12/2017 | Mu | B41J 2/04588 | |

\* cited by examiner

FLUID DROPLET METHODOLOGY AND APPARATUS FOR IMPRINT LITHOGRAPHY

FIELD OF THE DISCLOSURE

The present disclosure relates to imprint lithography, and more particularly to fluid droplet patterning for imprint lithography applications.

RELATED ART

Imprint lithography apparatuses and processes are useful in forming nanoscale patterns on semiconductor wafers in the fabrication of electronic devices. Such apparatuses and processes can include the use of fluid dispense systems for depositing a formable material, for example, a polymerizable material, such as a resin or a resist, onto the wafer, using techniques such as fluid droplet dispense. The dispensed material is contacted with an imprint template (or mold) having desired pattern features and then solidified, forming a patterned layer on the wafer. Template feature fill rates and related defects are dependent, in part, on template pattern feature density and orientation and the droplet pattern arrangement, including fluid droplet pitch.

Traditional fluid dispense systems include fluid dispense ports having a fluid dispense port pitch that determines the fluid droplet pitch in the same direction as the fluid dispense port pitch. Thus, there is no or limited ability to adjust the fluid dispense port pitch without replacing the fluid dispense head. Thus, there continues to be an industry demand for droplet pattern processes which are more finely adjustable and which are not limited by dispenser limitations.

SUMMARY OF THE INVENTION

In an aspect, a method can be used to generate a fluid droplet pattern for an imprint lithography process. The method comprises:
  providing a fluid dispense system having fluid dispense ports;
  determining a substrate fluid droplet pattern for dispensing a formable material onto a substrate;
  during a first pass, dispensing the formable material onto the substrate to form a first part of the substrate fluid droplet pattern for an imprint field, wherein the substrate and the fluid dispense ports move relative to each other in a translating direction;
  offsetting the fluid dispense ports and substrate relative to each other in an offset direction substantially perpendicular to the translating direction, wherein offsetting the fluid dispense ports is performed after dispensing the formable material during the first pass; and
  during a second pass, dispensing the formable material onto the substrate to form a second part of the substrate fluid droplet pattern for the imprint field, wherein dispensing the formable material during the second pass is performed after offsetting the fluid dispense ports.

In an embodiment, during the first pass, dispensing the formable material comprising dispensing fluid droplets of the formable material along a Y1 line of a drop edge exclusion (DEE); and during the second pass, dispensing the formable material comprising dispensing fluid droplets of the formable material along a Y2 line of the DEE.

In a particular embodiment, during the second pass, dispensing the formable material comprising dispensing a fluid droplet of the formable material at an intersection of an X2 line and the Y2 line of the DEE.

In another embodiment, the fluid dispense ports lie along a line, and the offset direction is substantially parallel to the line.

In a further embodiment, offsetting the fluid dispense ports in the offset direction is performed for an offset distance that is a non-integer multiple of a pitch.

In a particular embodiment, the fluid dispense ports have a fluid dispense port pitch, and the offset distance is a non-integer multiple of the fluid dispense port pitch.

In another embodiment, the first part of the substrate fluid droplet pattern is different from the second part of the substrate fluid dispense pattern.

In still another embodiment, the formable material is dispensed using a same single-pass fluid droplet pattern for the first and second passes, wherein the first part of the fluid droplet pattern is offset from the second part of the substrate fluid droplet pattern.

In a further embodiment,
  providing the fluid dispense system further comprises providing the fluid dispense system having the fluid dispense ports defining a line, the fluid dispense system further configured to dispense the fluid droplets of the formable material at a preset frequency to achieve spaced-apart droplets on a substrate at a preset minimum pitch as the substrate and the fluid dispense ports move relative to each other at a preset speed along in the translating direction that is substantially perpendicular to the line;
  determining a preset-defined fluid droplet pattern for dispensing the formable material onto the substrate, the preset-defined fluid droplet pattern based in part on a pattern of an imprint lithography template, and wherein the preset-defined fluid droplet pattern is representative of fluid droplets spaced apart on the substrate at the preset minimum pitch or an integer multiple thereof as the substrate and the fluid dispense ports are moved relative to each other at the preset speed along the transverse direction;
  determining an adjusted fluid droplet pattern based on the preset-defined fluid droplet pattern, wherein the adjusted fluid droplet pattern is representative of fluid droplets spaced apart at a non-integer multiple of the preset minimum pitch;
  determining an adjusted speed of the substrate and the fluid dispense ports relative to each other to generate the adjusted fluid droplet pattern formed during the first and second passes, wherein the adjusted speed is different than the preset speed during the first pass, the second pass, or each of the first and second passes; and
  during the first pass, the second pass, or each of the first and second passes, moving the substrate and the fluid dispense ports relative to each other at the adjusted speed in the translating direction, and dispensing the formable material through the fluid dispense ports at the preset frequency.

In a further embodiment, during the first and second passes, dispensing the formable material is performed such that centers of fluid droplets closest to the edges of the imprint field lie along X1, X2, Y1, and Y2 lines of a DEE.

In another aspect, a method can be used to manufacture an article. The method comprises:
  providing a fluid dispense system having fluid dispense ports;
  determining a substrate fluid droplet pattern for dispensing a formable material onto a substrate;

during a first pass, dispensing the formable material onto the substrate to form a first part of the substrate fluid droplet pattern for an imprint field, wherein the substrate and the fluid dispense ports move relative to each other in a translating direction;

offsetting the fluid dispense ports and substrate relative to each other in an offset direction substantially perpendicular to the translating direction, wherein offsetting the fluid dispense ports is performed after dispensing the formable material during the first pass;

during a second pass, dispensing the formable material onto the substrate to form a second part of the substrate fluid droplet pattern for the imprint field, wherein dispensing the formable material during the second pass is performed after offsetting the fluid dispense ports;

contacting the formable material with the template having a surface; and curing the formable material to form a layer corresponding to the surface of the template.

In an embodiment, the article includes an electronic device, and the substrate includes a semiconductor wafer.

In a further aspect, an apparatus for imprint lithography comprises:

a fluid dispense system having fluid dispense ports;

a stage adapted to move a substrate relative to the fluid dispense ports; and a logic element configured to:

determine a substrate fluid droplet pattern for dispensing a formable material onto the substrate;

transmit information to dispense the formable material onto the substrate during a first pass to form a first part of the substrate fluid droplet pattern for an imprint field, wherein the substrate and the fluid dispense ports move relative to each other in a translating direction;

transmit information to offset the fluid dispense ports and substrate relative to each other in an offset direction substantially perpendicular to the translating direction, wherein the apparatus is configured to offset the fluid dispense ports after an instruction to dispense the formable material during the first pass is executed; and transmit information to dispense the formable material onto the substrate during a second pass to form a second part of the substrate fluid droplet pattern for the imprint field, wherein the apparatus is configured to dispense the formable material during the second pass after an instruction to offset the fluid dispense ports is executed.

In an embodiment, the information to dispense the formable material onto the substrate during the first pass comprises particular information to dispense fluid droplets of the formable material along a Y1 line of the DEE; and the information to dispense the formable material onto the substrate during the second pass comprises particular information to dispense fluid droplets of the formable material along a Y2 line of the DEE.

In a particular embodiment, the information to dispense the formable material onto the substrate during the second pass comprises particular information to dispense a fluid droplet of the formable material at an intersection of an X2 line and the Y2 line of the DEE.

In another embodiment, the fluid dispense ports lie along a line, and the offset direction is substantially parallel to the line.

In a further embodiment, the fluid dispense ports have a fluid dispense port pitch, and the information to offset the fluid dispense ports comprises particular information to offset the fluid dispense ports in the offset direction for an offset distance that is a non-integer multiple of the fluid dispense port pitch.

In still another embodiment, the first part of the substrate fluid droplet pattern is different from the second part of the substrate fluid dispense pattern.

In yet another embodiment, the fluid dispense ports defining a line;

the fluid dispense system is further configured to dispense fluid droplets of the formable material at a preset frequency to achieve spaced-apart droplets on a substrate at a preset minimum pitch as the substrate is moved relative to the fluid dispense ports at a preset speed along the translating direction that is substantially perpendicular to the line; and the logic element is configured to:

determine a first fluid droplet pattern for dispensing the formable material onto the substrate, the first fluid droplet pattern based in part on a pattern of an imprint lithography template, and wherein the first fluid droplet pattern is representative of fluid droplets spaced apart on the substrate at the preset minimum pitch or an integer multiple thereof as the substrate and the fluid dispense ports move relative to each other at the preset speed along the translating direction;

determine a second fluid droplet pattern based on the first fluid droplet pattern, wherein the second fluid droplet pattern is representative of fluid droplets spaced apart at a non-integer multiple of the preset minimum pitch;

determine an adjusted speed of the substrate and the fluid dispense ports relative to each other to generate the second fluid droplet pattern, wherein the adjusted speed is different than the preset speed the substrate and the fluid dispense ports relative to each other; and transmit information to move the substrate and the fluid dispense ports relative to each other at the adjusted speed in the translating direction, and dispense the formable material through the fluid dispense ports at the preset frequency, wherein the information corresponds to the first pass, the second pass, or each of the first and second passes.

In a particular embodiment, the logic element is configured such that information to dispense the formable material comprises particular information such that the fluid dispense ports dispense the fluid droplets such that centers of fluid droplets closest to each of peripheral edges of the imprint field lie along X1, X2, Y1, and Y2 lines of the DEE.

BRIEF DESCRIPTION OF THE DRAWINGS

Embodiments are illustrated by way of example and are not limited in the accompanying figures.

Figure 1:
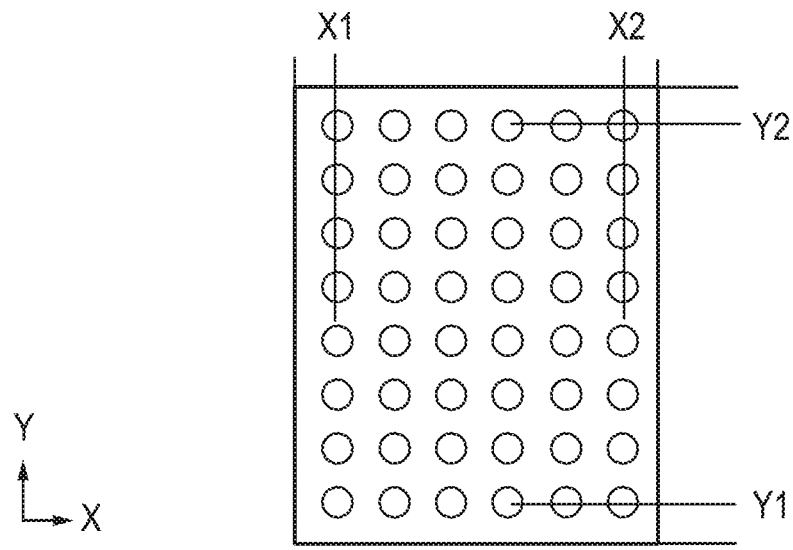
FIG. 1 includes a fluid droplet pattern in which the fluid droplet pitch matches the X-direction and Y-direction alignment for a drop edge exclusion.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

A fluid droplet pattern may refer to an actual pattern that physically exists or will exist or a virtual pattern that can be computer generated representation of fluid droplet pattern. The term "substrate fluid droplet pattern" refers to a particular actual pattern of fluid droplets as formed on a substrate. An "adjusted fluid droplet pattern" refers to a particular virtual droplet pattern, and in an embodiment, such virtual droplet pattern can be correspond to the substrate fluid droplet pattern produced when using the adjusted fluid droplet pattern.

The term "pitch" is intended to mean a distance from a center of a feature to a center of a next adjacent feature. For a fluid droplet pattern, the pitch is a distance from the center of a droplet to the center of the next adjacent droplet. In Cartesian coordinates, a two-dimensional pattern (a pattern as seen from a top or plan view) can have a pitch in the X-direction that corresponds to the distance between the centers of the features as measured in the X-direction (X-direction pitch), and a pitch in the Y-direction that corresponds to the distance between the centers of the features as measured in the Y-direction (Y-direction pitch). The X-direction pitch may be the same or different from the Y-direction pitch.

As used herein, speed and motion may be described on a relative basis. For example, object A and object B move relative to each other. Such terminology is intended to cover object A is moving, and object B is not; object A is not moving, and object B is moving; and both of objects A and B are moving.

As used herein, the terms "comprises," "comprising," "includes," "including," "has," "having," or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

The use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the imprint and lithography arts.

In imprint lithography, the formable material needs to be dispensed in a controlled matter to ensure that a proper amount of formable material is dispensed in correct locations and areal densities on the substrate. Centers of fluid droplets closest to the edges of the imprint field are placed such that, during an imprint operation, a proper amount of formable material can flow toward the edge of the imprint field. If the fluid droplets are too close to the edge, a portion of the formable material can flow beyond an edge of the imprint lithography template, and such portion of the formable material can result in an extrusion defect during a curing operation. The extrusion defect may adhere to the lithography template and cause the extrusion defect to be printed in the next imprint field. If the fluid droplets are too far from the edge, incomplete filling of template features may occur. Such defects are called "non-fill" defects and translate to a loss of features upon pattern transfer. Extrusion defects and non-fill defects are undesired.

A drop edge exclusion (DEE) refers to an exclusion around a substrate fluid droplet pattern to achieve a proper amount of formable material near the edge of an imprint field that reduces the likelihood that (1) the formable material will flow beyond the edge of the imprint lithography template and (2) non-fill defects will occur. FIG. 1 illustrates an idealized substrate fluid drop pattern with proper DEE. The imprint field can be expressed in Cartesian coordinates along an X-direction and a Y-direction. The centers of fluid droplets along the column closest to the left-hand side lie along a line that is a distance X1 from the left-hand edge, and the centers of fluid droplets along the column closest to the right-hand side lie along a line that is a distance X2 from the right-hand edge. The centers of fluid droplets along the column closest to the bottom of the imprint field lie along a line that is a distance Y1 from the bottom edge, and the centers of fluid droplets along the column closest to the top of the imprint field lie along a line that is a distance Y2 from the top edge. Such lines are referred to herein as the X1 line, X2 line, Y1 line, and the Y2 line of the DEE. In FIG. 1, the fluid droplets have a uniform pitch in each of the X-direction and the Y-direction.

Figure 2:
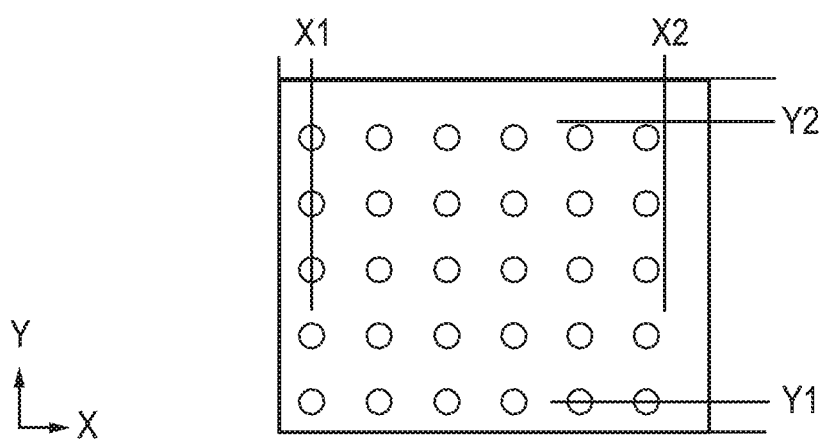
FIG. 2 includes a fluid droplet pattern in which the fluid droplet pitch does not match X-2 and Y-2 alignment for a drop edge exclusion.

In actual practice, the proper DEE is difficult to obtain. FIG. 2 includes an illustration in which the substrate fluid droplet pattern has centers of fluid droplets along the X1 and Y1 lines but does not have centers of fluid droplets along the X2 and Y2 lines of the DEE. The substrate fluid droplet pattern in FIG. 2 has a significantly higher risk of non-fill defects along the top and right-hand edge of the imprint field as compared to FIG. 1. If an extra row or column were dispensed along the top or right-hand side of the imprint field at the same pitch in FIG. 2, then formable material would be too close to the edge of the imprint field. Such a substrate fluid droplet pattern has a significantly higher risk that formable material would flow beyond an edge of the lithographic imprint template and result in an extrusion defect.

In this specification, solutions to issues caused the fluid dispense port pitch are addressed herein. In FIG. 2, the fluid dispense port pitch is in the Y-direction. The fluid dispense ports and the substrate can be offset relative to each other between different passes of dispensing the formable material. This specification will briefly address the issues and solution for the X-direction to allow centers of fluid droplets to be dispensed along the X1, X2, Y1, and Y2 lines of the DEE.

Details regarding the apparatus and method are better understood after reading this specification in conjunction with figures. The description below is meant to illustrate embodiments and not limit the scope of the present invention, which is defined in the appended claims.

Figure 3:
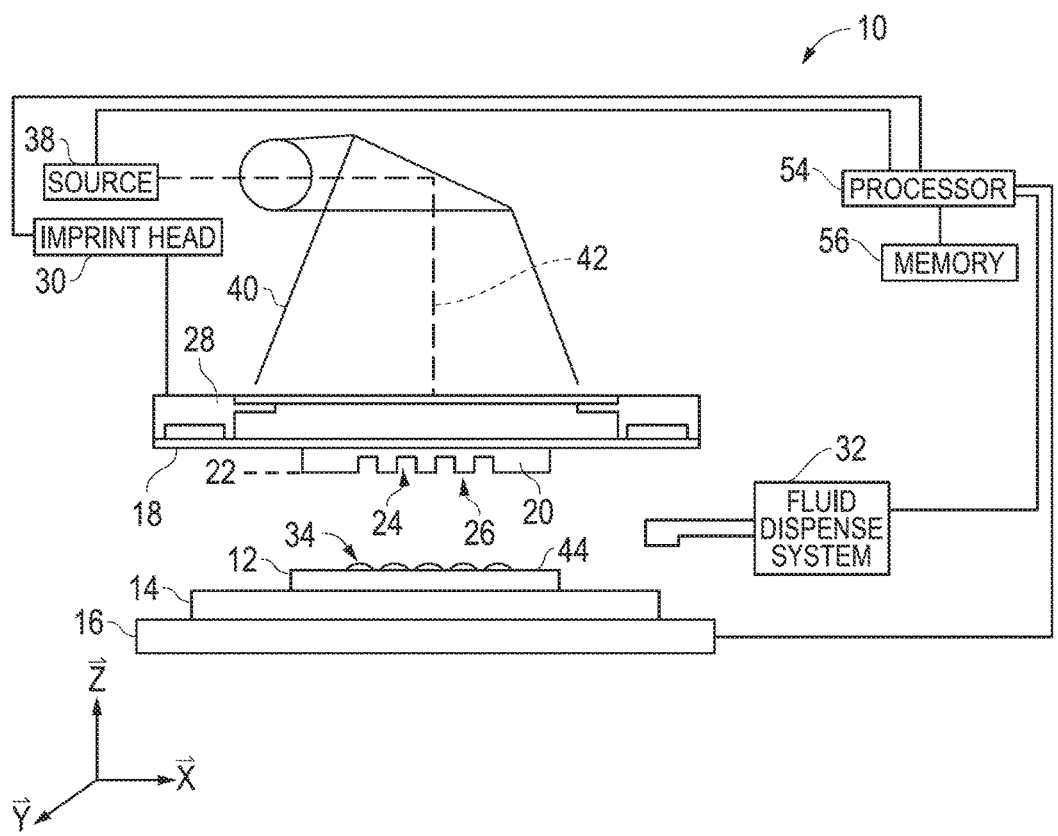
FIG. 3 includes a simplified side view of an exemplary imprint lithography system.

Referring to the figures, and particularly to FIG. 3, a lithographic system 10 in accordance with embodiments described herein can be used to form a relief pattern on a substrate 12. The substrate 12 may be coupled to a substrate chuck 14. As illustrated, substrate chuck 14 is a vacuum chuck; however, in other embodiments the substrate chuck 14 may be any chuck including vacuum, pin-type, groove-type, electrostatic, electromagnetic, or the like. Exemplary chucks are described in U.S. Pat. No. 6,873,087, which is hereby incorporated by reference in its entirety herein.

Substrate 12 and substrate chuck 14 may be further supported by a stage 16. The stage 16 may provide translating or rotational motion along the X-, Y-, or Z-directions. The stage 16, substrate 12, and substrate chuck 14 may also be positioned on a base (not illustrated).

Spaced-apart from the substrate 12 is a template 18. The template 18 can include a body having a first side and a second side with one side having a mesa 20 extending therefrom towards the substrate 12. The mesa 20 is sometimes referred to as a mold 20. In an embodiment, the template 18 can be formed without a mesa 20.

The template 18 or mold 20 may be formed from such materials including fused-silica, quartz, silicon, organic polymers, siloxane polymers, borosilicate glass, fluorocarbon polymers, metal, hardened sapphire, other similar materials, or any combination thereof. The template 18 and mold 20 can include a single piece construction. Alternatively, the template 18 and mold 20 can include separate components coupled together. As illustrated, a patterning surface 22 includes features defined by spaced-apart recesses 24 and protrusions 26. The disclosure is not intended to be limited to such configurations (e.g., planar surfaces). The patterning surface 22 may define any original pattern that forms the basis of a pattern to be formed on the substrate 12. In another embodiment, the patterning surface 22 can be a blank, that is, the patterning surface 22 does not have any recesses or projections.

The template 18 can be coupled to a chuck 28. The chuck 28 can be configured as vacuum, pin-type, groove-type, electrostatic, electromagnetic, or another similar chuck type. Exemplary chucks are further described in U.S. Pat. No. 6,873,087. In an embodiment, the chuck 28 may be coupled to an imprint head 30 such that the chuck 28 or imprint head 30 can facilitate movement of the template 18.

The lithographic system 10 can further include a fluid dispense system 32 used to deposit a formable material 34 on the substrate 12. For example, the formable material can include a polymerizable material, such as a resin. The formable material 34 can be positioned on the substrate 12 in one or more layers using techniques such as droplet dispense, spin-coating, dip coating, chemical vapor deposition (CVD), physical vapor deposition (PVD), thin film deposition, thick film deposition, or combinations thereof. The formable material 34 can be dispensed upon the substrate 12 before or after a desired volume is defined between the mold 20 and the substrate 12 depending on design considerations. For example, the formable material 34 can include a monomer mixture as described in U.S. Pat. Nos. 7,157,036 and 8,076,386, both of which are herein incorporated by reference in their entireties.

Figure 4:
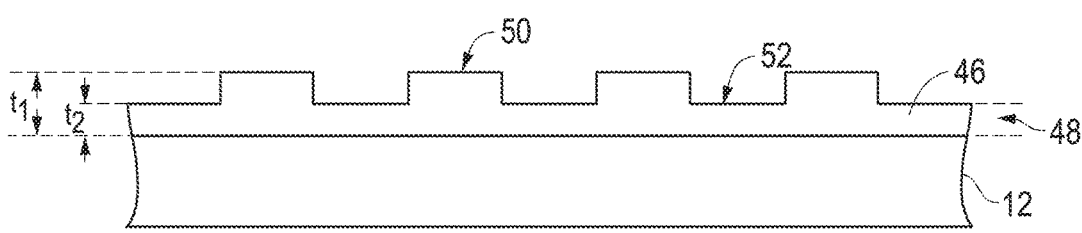
FIG. 4 includes a simplified cross-sectional view of the substrate illustrated in FIG. 3, having a patterned layer.

Referring to FIGS. 3 and 4, the lithographic system 10 can further include an energy source 38 coupled to a direct energy 40 along a path 42. The imprint head 30 and stage 16 can be configured to position the template 18 and substrate 12 in superimposition with the path 42. The lithographic system 10 can be regulated by a logic element 54 in communication with the stage 16, imprint head 30, fluid dispense system 32, or source 38, and may operate on a computer readable program, optionally stored in memory 56.

In an embodiment, either the imprint head 30, the stage 16, or both the imprint head 30 and the stage 16 vary a distance between the mold 20 and the substrate 12 to define a desired volume therebetween that is filled by the formable material 34. For example, the imprint head 30 can apply a force to the template 19 such that the mold 20 contacts the formable material 34 on the substrate 12. After the desired volume is filled with the formable material 34, the source 38 can produce energy 40, e.g., ultraviolet radiation, causing the formable material 34 to solidify or cross-link conforming to a shape of the surface 44 of the substrate 12 and patterning surface 22 defining a patterned layer 46 on the substrate 12. The patterned layer 46 can include features illustrated as protrusions 50 and recessions 52, with the protrusions 50 having a thickness, $t_1$ and the recessions 52 correspond to a residual layer having a thickness $t_2$, which is the residual layer thickness (RLT).

High throughput at low defect density is an important consideration in imprint lithography processes. When employing a droplet dispense method of applying the formable material to the substrate 12, the imprint process cycle generally includes (1) dispensing (or depositing) fluid droplets of formable material on a substrate surface, (2) bringing a template into contact with the fluid droplets such that the fluid spreads and fills the topography of the template patterning surface, (3) solidifying (e.g., photocuring) the fluid, and (4) separating the template from the substrate 12, leaving a solidified layer of formable material having a relief image of the template pattern on the substrate surface. Dispensing fluid droplets of formable material on the substrate surface and proper filling of the pattern of the template 18 are major contributors to the imprint cycle time, and thus throughput. Particular template patterns may require multiple passes of the substrate 12 relative to the imprint head 30. That is, the substrate 12 and imprint head 30 must be translated relative to each other multiple times. Multiple dispensing passes are common, for example, when templates have dense feature patterns or for particular patterns requiring adjacent droplets be positioned closer together. Methods and systems to reduce dispense time are described in accordance with one or more embodiments described herein.

During dispensing, fluid droplets of formable material are dispensed from the fluid dispense system 32 to create a pattern of fluid droplets on the substrate surface 44. The fluid droplet pattern can be determined such that the total volume of the fluid droplets on the surface matches the total volume for the desired fluid droplet pattern. As well as matching the total volume of the desired fluid droplet pattern, it may be desirable to match the local volume of the desired fluid droplet pattern. Thus, a greater volume of fluid can be dispensed in a region of the substrate 12 where a greater volume of formable material is desired.

Available inkjet systems can be tuned to dispense formable material fluid droplets with volumes in the range of 0.1 to 10 picoliters (pL) or greater, with 0.9 pL being an exemplary fluid droplet volume. The fluid droplets can be dispensed in patterns formed by one or more passes of the imprint head 30 and substrate 12 relative to one another. An exemplary pattern includes a rectangular, grid pattern, a diamond pattern, another suitable pattern, or any combination thereof.

Figure 5:
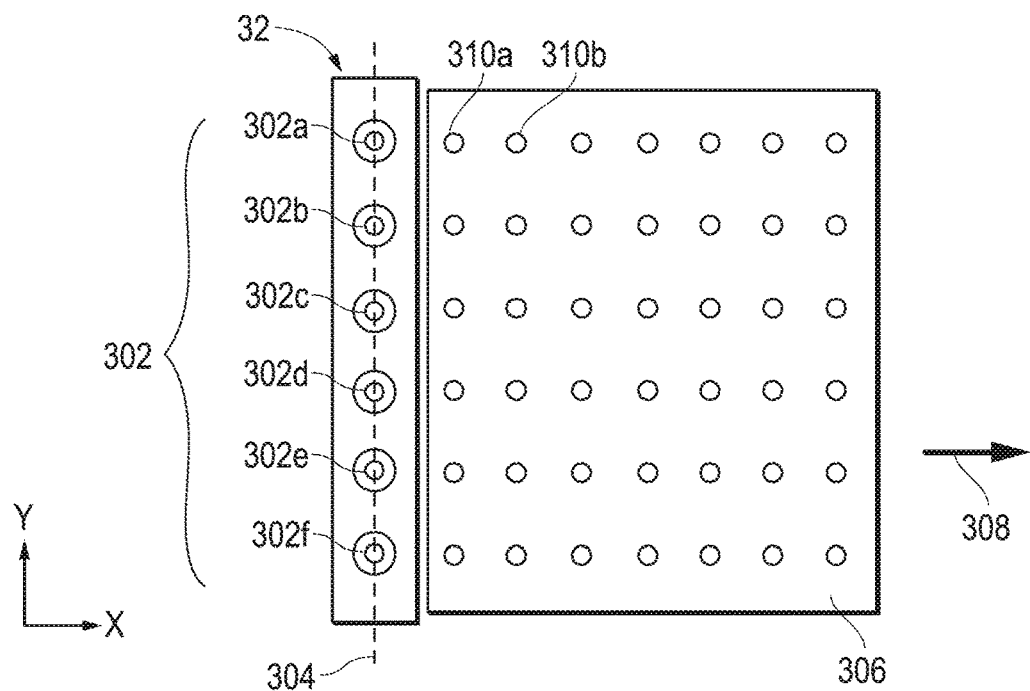
FIG. 5 includes a simplified top view of a fluid dispense system including fluid dispense ports and an exemplary droplet pattern deposited upon a substrate surface.

Referring to FIG. 5, the fluid dispense system 32 can include fluid dispense ports 302. As illustrated, the fluid dispense system 32 includes six fluid dispense ports 302a, 302b, 302c, 302d, 302e, and 302f; however, the number of fluid dispense ports 302 can be less than or greater than six, such as for example, at least two fluid dispense ports, at least three fluid dispense ports, at least four fluid dispense ports, at least five fluid dispense ports, at least ten fluid dispense ports, or at least twenty fluid dispense ports. In an embodiment, the fluid dispense ports 302 can include a set of at least three fluid dispense ports (e.g., fluid dispense ports 302a, 302b, and 302c) lying along a straight line 304. In traditional dispensing operations of formable material, a Y-direction pitch is fixed by a distance between centers of adjacent fluid dispense ports, and therefore, the Y-direction pitch is determined by the physical layout of the fluid dispense ports 302 in the fluid dispense head.

The fluid dispense system 32 and a surface 306 located there below (e.g., on the substrate 12 or the substrate chuck 14) can be moveable in a translating direction (illustrated by arrow 308). Fluid droplets, including fluid droplets 310a and 310b, can be dispensed from the fluid dispense ports 302 onto the surface 306 in rows and columns.

A fluid dispense head (and the control software that operates it) has preset parameters (hereinafter "presets") that can limit the flexibility of the fluid dispense system. The fluid dispense head has a preset firing frequency that is programmed to produce a preset minimum pitch (X-direction pitch in the embodiment illustrated) when the substrate 12 is translated at a preset scan speed in the X-direction. The software control has difficulty with non-integer multiples of the preset minimum pitch. Accordingly, only a limited number of fluid droplet patterns that can be produced based on locations on a corresponding X-Y grid. Thus, the software control simply determines the closest integer of preset minimum pitch. For example, a fluid dispense system may have a preset minimum pitch in the X-direction of 35 microns. For an integer-based fluid droplet pattern, allowable integer values include 35 microns, 70 microns, 105 microns, etc. for the fluid droplet pitch in the X-direction.

The limitations on the fluid dispense port pitch and presets of the apparatus can allow a less-than ideal droplet pattern. An initial alignment of the substrate 12 and the fluid dispense ports 302 relative to each other allows the centers of the fluid droplets closest to the edges of the imprint field to lie along the X1 and Y1 lines of the DEE. The problems are obtaining centers of fluid droplets along the X2 and Y2 lines of the DEE.

In an embodiment, between passes in dispensing the formable material, the fluid dispense ports 302 can be offset in an offset direction for an offset distance. In the embodiment as illustrated, the offset direction can be substantially perpendicular to the translating direction 308, substantially parallel to the line 304, or both. As used herein, substantially perpendicular means±10° of perpendicular, and substantially parallel means±10° of parallel. The offset distance can be non-integer multiple of the fluid dispense port pitch. The offset provides centers of fluid droplets along the Y-2 line of the DEE. More detail regarding the offset is provided with respect to the process flow in FIG. 6.

With respect to the X2 line of the DEE, the presets of the apparatus can provide a preset-defined fluid droplet pattern having a preset minimum pitch in the X-direction, that can be rendered into an adjusted fluid dispense pattern by adjusting a translating speed (X-direction) of the substrate 12. In an embodiment, the software control can determine a best integer-based droplet pattern having the preset minimum pitch, and then a stage, the fluid dispense head, or both can be set to a translating speed, in combination with the firing frequency of the fluid dispense system, to achieve the substrate fluid droplet pattern corresponding to the adjusted fluid droplet pattern, which is closer to an ideal droplet pattern as compared to the preset-defined droplet pattern (before adjustment of the translating speed is made). The adjusted fluid droplet pattern is based on a non-integer multiple of the preset minimum pitch. More details regarding the adjusted fluid droplet pattern is provided with respect to FIG. 7.

Figure 6:
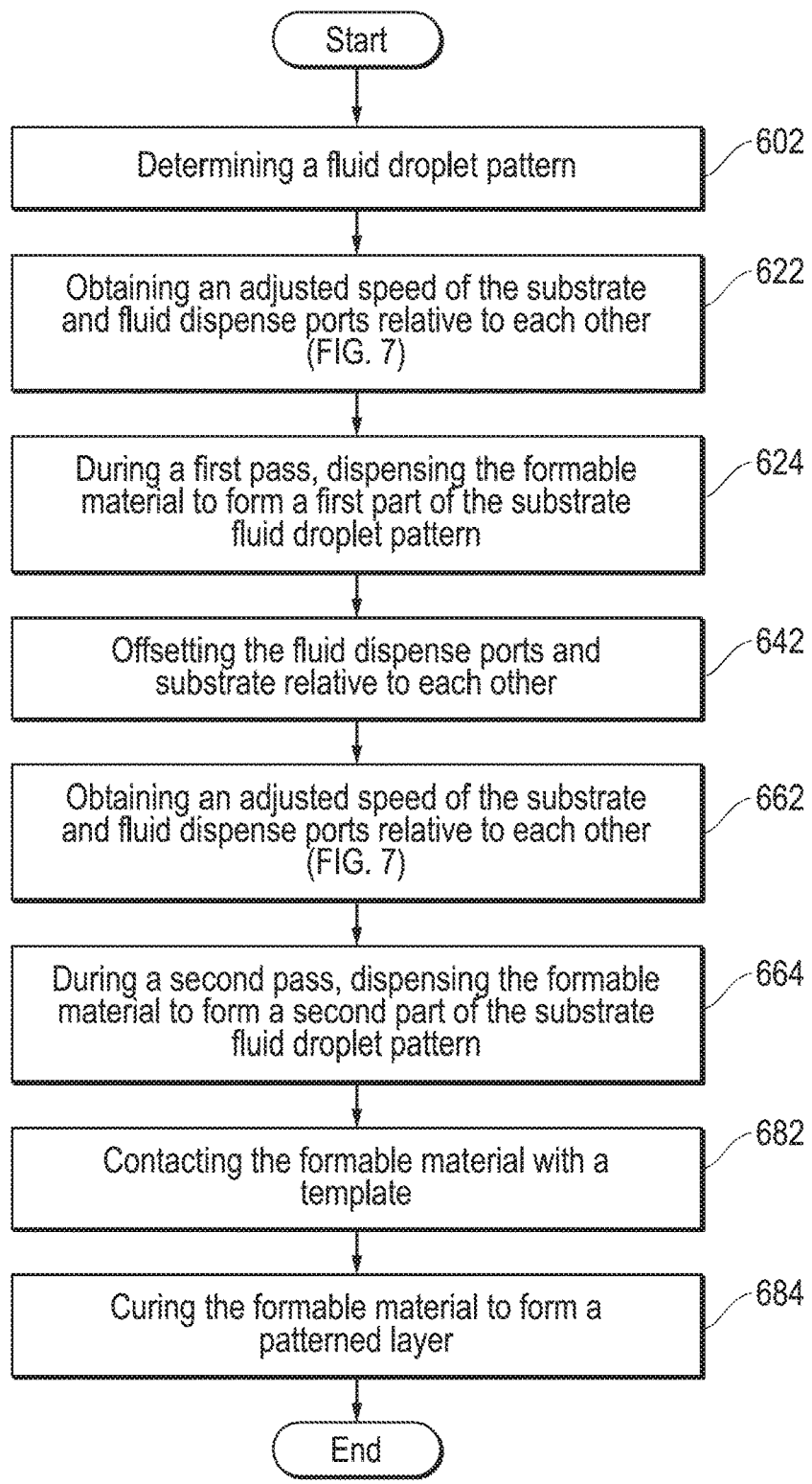

In accordance with an embodiment described herein, FIG. 6 includes a flow chart for a method that can be used forming a substrate fluid droplet pattern for an imprint lithography process that includes an offset between passes of dispensing the fluid droplets. The method can be performed by an imprint lithography apparatus including a fluid dispense system, a stage, and a logic element. In an embodiment, a fluid dispense system having fluid dispense ports 302 lying along a line. The fluid dispense system can further be configured to dispense fluid droplets of a formable material at a preset frequency to achieve spaced-apart droplets on a substrate 12 at a preset minimum pitch. The stage, the fluid dispense head, or both can be adapted to move a relative to each other in a translating direction. The translating direction can be substantially perpendicular to the line. The logic element can include hardware, firmware, software, or any combination thereof to perform many of the operations described herein. In a particular embodiment, the logic element can be the processor 54. The substrate 12 can be placed on the stage, and in an embodiment, the substrate 12 can be a semiconductor wafer.

The method can include determining a substrate fluid droplet pattern for dispensing the formable material onto the substrate, at block 602 in FIG. 6. In this particular embodiment, the formable material is dispensed using more than one pass. In a particular embodiment, the preset minimum pitch in the translating direction (X-direction) may allow centers of fluid droplets to be dispensed along the X1 and Y1 lines of the DEE. However, as previously described and illustrated in FIG. 2, the presets can limit the ability to dispense in translating direction and dispense centers of fluid droplets on the X2 line of the DEE. Therefore, some adjustment for dispensing may be needed. At block 622, the process can include obtaining an adjusted speed of the substrate 12 and fluid dispense ports relative to each other, which is addressed in more detail with respect to FIG. 7. After reading this specification, skilled artisans will appreciate that obtaining the adjusted speed is not required in all embodiments, and therefore, obtaining the adjusted speed may be optional.

Figure 7:
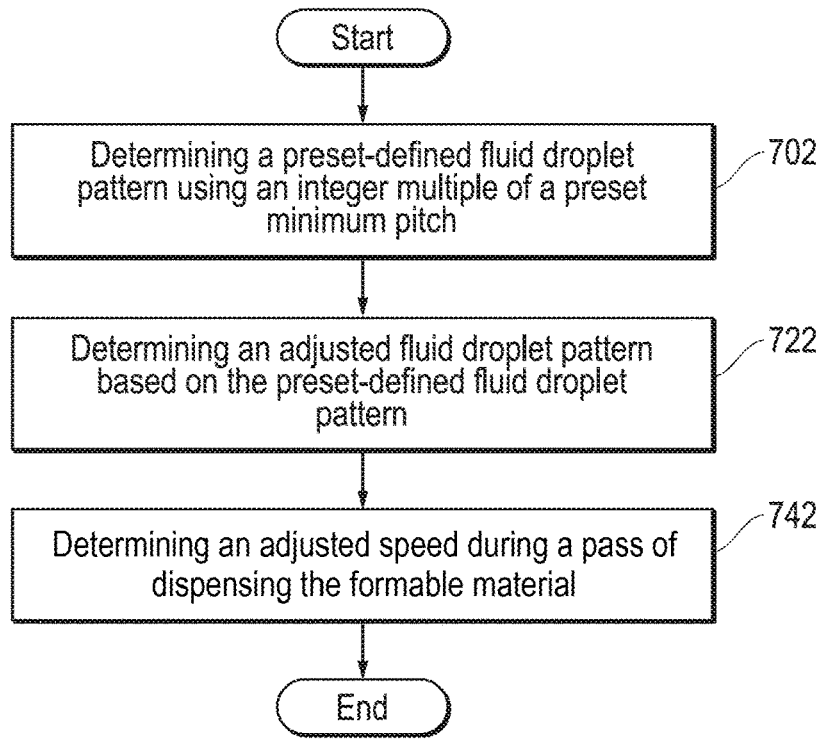
FIGS. 6 and 7 includes a flow chart of an exemplary method of forming an article, including generating a fluid droplet pattern.

The actions used to determine the adjusted speed are addressed and described with respect to FIG. 7. The adjusted speed allows a user to achieve a desired substrate fluid droplet pattern for a particular pass to dispense centers of the fluid droplets along the X1 and X2 lines of the DEE, where the fluid droplet pitch in the translating direction (X-direction) is a non-integer multiple of the preset minimum pitch.

At block 702, the method can include determining a preset-defined fluid droplet pattern using a preset minimum pitch or an integer multiple thereof. The preset-defined fluid droplet pattern can be based at least in part on a pattern of an imprint lithography template. The preset-defined fluid droplet pattern is representative of fluid droplets at the preset minimum pitch or an integer multiple thereof as the substrate 12 and the fluid dispense ports 302 are moved relative to each other along the translating direction. Thus, the preset-defined fluid droplet pattern has an integer-based preset minimum pitch.

At block 722, the method can further include determining an adjusted fluid droplet pattern based on the preset-defined fluid droplet pattern. The adjusted fluid droplet pattern is representative of fluid droplets spaced apart at a non-integer multiple of the preset minimum pitch.

At block 742, the method can include determining an adjusted speed used in generating the adjusted fluid droplet pattern. As compared to the preset speed for the preset-defined fluid droplet pattern, the adjusted speed for the adjusted fluid droplet pattern allows for a more ideal fluid droplet pattern that can result in less non-fill defects, a desired RLT, or both. The logic element can include circuits, a program, or other logic to determine the preset-defined fluid droplet pattern, the adjusted fluid droplet pattern, and the adjusted speed.

As an example, a pitch of 60 microns may work best for a particular patterned layer to be achieved; however, 60 microns is 1.7 times 35 microns. Clearly, 1.7 is not an integer multiple of the preset minimum pitch of 35 microns. Accordingly, the speed adjustment can be made without having to reprogram any of the dispense head presets. For example, the speed of the substrate 12 and the fluid dispense ports 302 relative to each other can be adjusted to be 1.7 times the speed used for the preset minimum pitch of 35 microns. The prior example provides a tangible example and is not meant to limit the scope of the present invention. Other non-integer values for the speed can be greater than 1.00, such as 1.01 X, 1.5 X, 2.1 X, 3.7 X, less than 1.00 and include 0.97 X, 0.86 X, 0.71 X, 0.57 X, 0.43 X, 0.29 X, 0.14 X, 0.03 X, or another non-integer value, where X represents the preset speed, and accordingly, the factor by which the preset speed is to be multiplied. The concepts described herein can apply to other preset minimum pitch and corresponding speed values. After determining the adjusted speed, the apparatus is ready for processing the substrate 12. Thus the process flow returns to FIG. 6.

Figure 8:
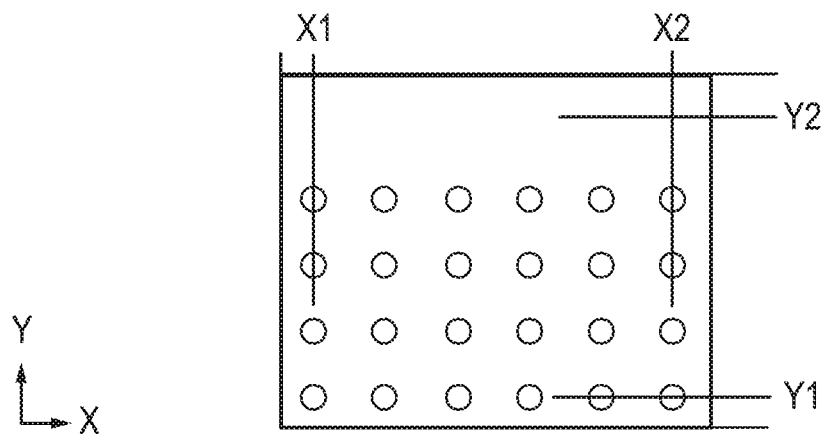
FIG. 8 includes a simplified top view of a surface including part of a substrate fluid droplet pattern formed after a single pass in accordance with an embodiment.

The substrate 12 is placed and held onto the stage. The method can include, during a first pass, dispensing the formable material to form a first part of the substrate fluid droplet pattern, at block 624. During the first pass, the substrate 12 and the fluid dispense ports 302 can move relative to each other in a translating direction at the adjusted speed. In a particular embodiment, the logic element can transmit information regarding the adjusted speed to the stage or a stage controller, to the fluid dispense head or a fluid dispense controller, or any combination thereof. The adjusted speed is the relative speed of the stage (and consequently, the substrate 12) and the fluid dispense ports 302 to each other. FIG. 8 includes an illustration of an imprint field on the substrate after fluid droplets for the first pass have been dispensed. Centers of fluid droplets are along the X1, X2, and Y1 lines of the DEE. In a particular embodiment, the center of a fluid droplet may lie at the intersection of the X1 and Y1 lines of the DEE. No centers of fluid droplets lie along the Y2 line of the DEE.

At block 642, the method can further include offsetting the fluid dispense ports and substrate relative to each other after dispensing the formable material during the first pass. The offset is to position the fluid dispense ports 302 to allow centers of fluid droplets to be dispensed along the Y2 line of the DEE. Offsetting is in an offset direction for an offset distance. The offset direction can be substantially perpendicular to the translating direction, substantially parallel to the line defined by the fluid dispense ports 302, or both. In the embodiment as described, the offset direction can be in the Y-direction. The offset distance can be non-integer multiple of the fluid dispense port pitch.

The fluid dispense port pitch may be limited to constraints of the apparatus, such as the configuration of the fluid dispense head that holds the fluid dispense ports 302 in place. For example, the fluid dispense port pitch may be 20 microns, and during the first pass, adjacent rows of fluid droplets may be 40 microns apart. In this embodiment, the distance between the Y1 and Y2 lines of the DEE is not an integer multiple of the fluid dispense port pitch. To achieve centers of droplets along the Y2 line of the DEE, the fluid dispense port can be moved for an offset distance of 50 microns. Clearly, 50 microns is not an integer multiple of the fluid dispense port pitch of 20 microns. Accordingly, the substrate 12 and the fluid dispense ports 302 may be moved relative to each other in the Y-direction for a distance of 50 microns. The prior example provides a tangible example and is not meant to limit the scope of the present invention. Other non-integer values for the speed can be greater than 1.00, such as 1.01 Y, 1.5 Y, 2.1 Y, 3.7 Y, less than 1.00 and include 0.97 Y, 0.86 Y, 0.71 Y, 0.57 Y, 0.43 Y, 0.29 Y, 0.14 Y, 0.03 Y, or another non-integer value, where Y represents the fluid dispense port pitch, and accordingly, the factor by which the dispense port pitch is to be multiplied. The concepts described herein can apply to other dispense port pitches and corresponding offset distances. After determining the offset distance, the logic element 54 can transmit information to the stage or stage controller so that the substrate 12 and fluid dispense ports 302 are moved relative to each other in the offset direction (Y-direction) for the offset distance (50 microns). Thus the process flow returns to FIG. 6.

At block 662, the process can include obtaining an adjusted speed of the substrate and fluid dispense ports relative to each other. The considerations and process for obtaining the adjusted speed as the same as previously described with respect to block 622. Note that the adjusted speed for block 622 may be the same or different from the adjusted speed for block 662. Further, the translating speed may not be adjusted for one of the blocks 622 and 662 and adjusted for the other of the blocks 622 and 662. Still further, an adjusted speed may not be used for both dispense operations in blocks 624 and 664.

Figure 9:
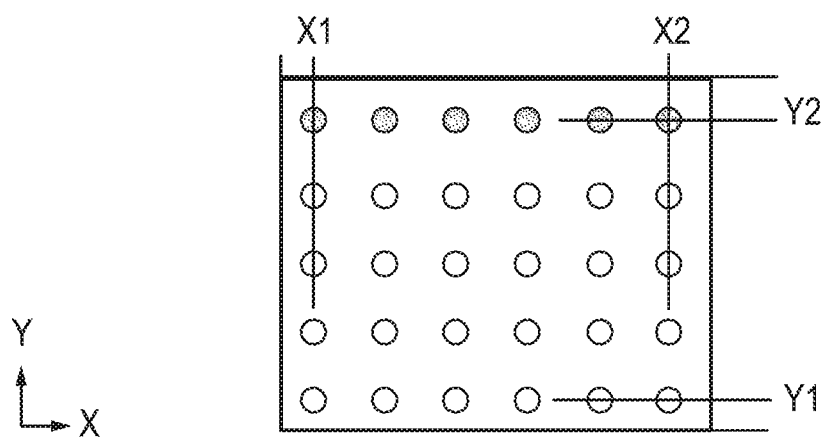
FIG. 9 includes a simplified top view of the surface of FIG. 8 after forming another part of the substrate fluid droplet pattern during another pass in accordance with an embodiment.

The method can include, during a second pass, dispensing the formable material to form a second part of the substrate fluid droplet pattern, at block 664. During the second pass, the substrate and the fluid dispense ports 302 can move relative to each other in a translating direction at the adjusted speed. In particular, the logic element can transmit information regarding the adjusted speed to the stage or a stage controller, to the fluid dispense head or a fluid dispense controller, or any combination thereof. The adjusted speed is the relative speed of the stage (and consequently, the substrate) and the fluid dispense ports 302 to each other. FIG. 9 includes an illustration of an imprint field on the substrate with fluid droplets of the first and second passes have been dispensed. The centers of fluid droplets are along the Y2 line of the DEE. In a particular embodiment, a fluid droplet lies at the intersection of the X2 and Y2 lines of the DEE. Centers of some of fluid droplets from the second pass may or may not line along the X1 and X2 lines of the DEE. No centers of fluid droplets from the second pass lie along the Y1 line of the DEE.

Figure 10:
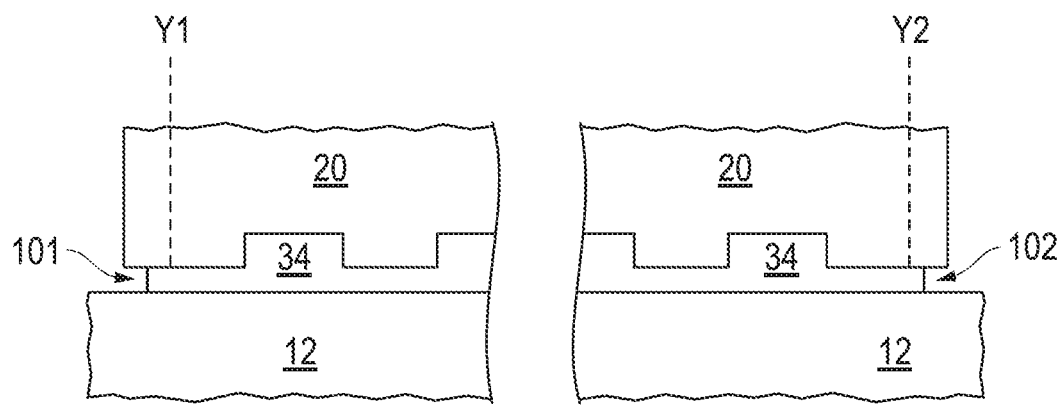
FIG. 10 includes an illustration of the substrate and imprint lithography template during imprinting.

At block 682, the method can include contacting the formable material with the template having a patterned surface. In an embodiment, the patterned surface has projections and recessions, and in another embodiment, the patterned surface can be a blank (a flat surface without any projections or recessions). FIG. 10 includes an illustration of portions of the substrate 12, formable material 34, and the mold 20. The left-hand portion illustrates the edge of the imprint field adjacent to the Y1 line of the DEE, and the right-hand portion illustrates the edge of the imprint field adjacent to the Y2 line of the DEE. The contact between the mold 20 of the template and the formable material 34 causes recessions in the mold 20 to fill and fill in the gaps between fluid droplets. The proper dispensing of fluid droplets allows some of the formable material to flow further from the Y1 and Y2 lines of the DEE and toward the edge of the imprint field; however, the formable material 34 does not flow beyond the edges of the mold 20. Gaps 101 and 102 between the edges of the formable material 34 and the mold 20 are controlled and kept relatively small.

At block 684, the method includes curing the formable material to form a patterned layer corresponding to the pattern surface of the template. Curing can be performed by exposure to electromagnetic radiation. In an embodiment, the electromagnetic radiation can be ultraviolet radiation. In another embodiment, the formable material can be cured using heat. The patterned layer on the substrate 12 has a complementary pattern as compared to the patterned surface of the template. Projections along the patterned layer correspond to recessions in the patterned surface of the template, and recessions in the patterned layer correspond to projections along the patterned surface of the template. The recessions in the patterned layer are parts of the residual layer.

A substrate fluid dispense pattern can take many different shapes. An exemplary pattern includes a rectangular, grid pattern, a diamond pattern, another suitable pattern, or any combination thereof.

Figure 11:
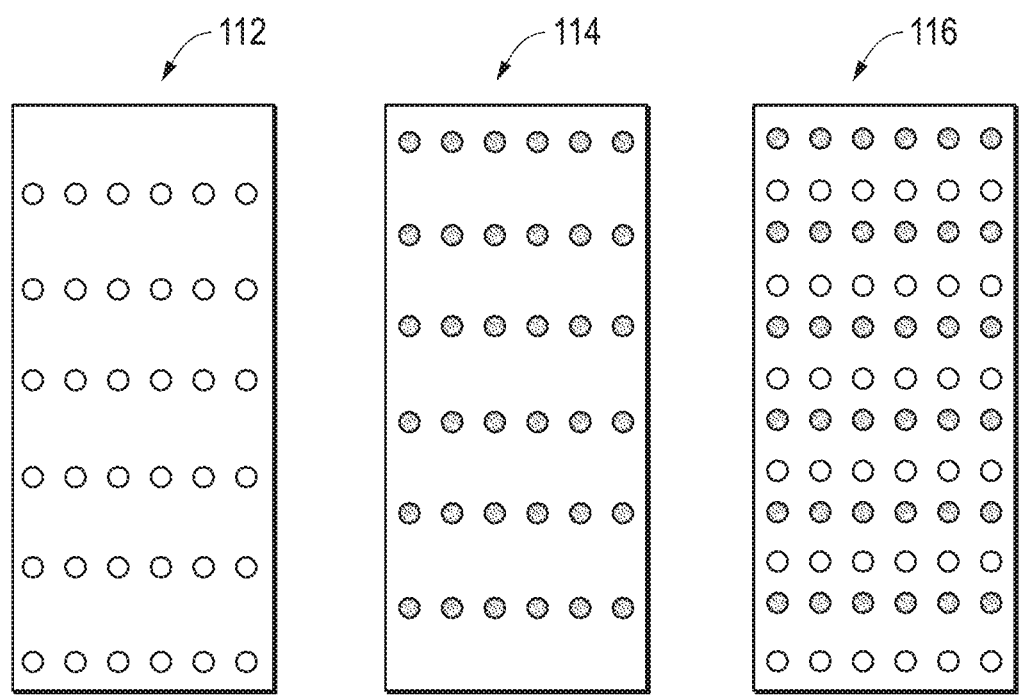
FIG. 11 includes a simplified top view of adjusted and substrate fluid droplet patterns in accordance with another embodiment.

In a further embodiment, the different passes may have the same pattern and are merely offset from each other. FIG. 11 includes adjusted fluid droplet dispense patterns 112 and 114 for the first and second passes, respectively, and a substrate fluid droplet dispense pattern 116 formed using the patterns 112 and 114. The adjusted fluid droplet dispense patterns 112 and 114 have the same X-direction fluid droplet pitch and Y-direction fluid direction pitch. The adjusted fluid droplet dispense patterns 112 and 114 are the same with the only difference being the offset. The processor 54 can transmit instructions to the fluid dispense system 32 and stage or stage controller to dispense fluid droplets onto the substrate corresponding to the adjusted fluid droplet dispense pattern 112, offset the substrate and fluid dispense ports 302 relative to each other, and then dispense fluid droplets onto the substrate corresponding to the adjusted fluid droplet dispense pattern 114 to achieve the substrate fluid droplet dispense pattern 116. In the embodiment as illustrated in FIG. 11, along each of the columns, the fluid droplets lie along the same line, and the columns have the same pitch. However, while each of the adjusted fluid droplet dispense patterns 112 and 114 have rows with the same pitch, the rows of the substrate fluid droplet dispense pattern 116 has rows with non-uniform pitch. Between two adjacent rows of fluid droplets from the first pass, the row of fluid droplets from the second pass between such adjacent rows of the first pass is closer to one of the adjacent rows as compared to the other adjacent row. The substrate fluid dispense pattern 116 has centers of fluid droplet along the X1, X2, Y1, and Y2 lines of the DEE, and therefore, will not have non-fill or extrusion defect issues.

In a particular embodiment, the logic element may be the processor 54. The logic element may be split between different parts of the apparatus. For example, some operations of the logic element may be performed by the processor 54, and other operations of the logic element may be performed by stage controller, a fluid dispense head controller, or the like. The information can be in the form of instructions to be executed, signals, pulses, or the like. The stage 16, the fluid dispense system 32, or both may include a controller that can act on instructions received from the processor 54. In another embodiment, the stage 16, the fluid dispense system 32 may respond to analog signals received. For example, the information can be a particular direct current voltage or a light pulse. After reading this specification, skilled artisans will be able to configure an imprint lithography apparatus to meet the needs or desires in view of the equipment within the apparatus. Thus, the description of the embodiments does not limit the scope of the present invention.

After reading this specification, skilled artisans will appreciate that many other substrate fluid drop patterns can be formed and still allow centers of fluid droplets to have centers along the X1, X2, Y1, and Y2 lines of the DEE. The offset of substrate 12 and the fluid droplet dispense ports 302 relative to each other can be performed without significantly affecting the ability to properly fill recessions in the template. Furthermore, more than two passes may be used to achieve fluid droplets along the X1, X2, Y1, and Y2 line of the DEE. After all passes are completed, the substrate fluid droplet dispense pattern will have centers of fluid droplets lying along the X, X2, Y1, and Y2 lines of the DEE.

Patterned layers formed in accordance with embodiments herein have fewer defects as compared to corresponding patterned layers where dispensing formable material occurs without using the offset. More particularly, it has been found that patterned layers formed in accordance with embodiments herein have fewer defects as compared to corresponding patterned layers having rows and columns of fluid droplets closest to the edges of the imprint field such centers of such fluid droplets do not lie at the proper locations with respect as DEE. Without the offset, when centers of droplets closest to the edge of the imprint field are closer to the central region, insufficient formable material may be formed at the edge of the imprint field corresponding to the Y2 line, and non-fill defects are more likely. When centers of droplets closest to the edge of the imprint field are too close to the edge of the imprint field, formable material may flow beyond the edge of the template, and an extrusion defect is more likely. Thus, the offset allows for good filling characteristics and reduce the likelihood of non-fill defects and extrusion defects.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A method of generating a fluid droplet pattern for an imprint lithography process, the method comprising:
    during a first pass, dispensing a formable material onto a surface of a substrate by a fluid dispense system having fluid dispense ports to form a first substrate fluid droplet pattern for a first part of an imprint field of the substrate, wherein the substrate and the fluid dispense ports move relative to each other along a translating axis;
    offsetting the fluid dispense ports and substrate relative to each other; and
    during a second pass, dispensing the formable material onto the surface of the substrate by the fluid dispense system to form a second substrate fluid droplet pattern for a second part of the imprint field, wherein offsetting the fluid dispense ports and substrate relative to each other is performed between the first pass and the second pass;
    wherein:
        the first substrate fluid droplet pattern has fluid droplets of the formable material lying along a plurality of lines, wherein lines of the plurality of lines are spaced apart from one another at a pitch in a y-direction, and
        offsetting is along a plane parallel to the surface of the substrate in a direction of the pitch for an offset distance that is a non-integer multiple of the pitch.

2. The method of claim 1, wherein:
    during the first pass, dispensing the formable material comprising dispensing fluid droplets of the formable material along a Y1 line of a drop edge exclusion; and
    during the second pass, dispensing the formable material comprising dispensing fluid droplets of the formable material along a Y2 line of the drop edge exclusion, wherein the offsetting direction is substantially perpendicular to the translating axis.

3. The method of claim 2, wherein during the second pass, dispensing the formable material comprising dispensing a fluid droplet of the formable material at an intersection of an X2 line and the Y2 line of the drop edge exclusion.

4. The method of claim 1, wherein:
    fluid dispense system dispenses the fluid droplets of the formable material at a preset frequency to achieve spaced-apart droplets on a substrate at a preset minimum pitch as the substrate and the fluid dispense ports move relative to each other at a preset speed along the translating axis; and
    the fluid droplets in the imprint field are formed at a non-integer multiple of the preset minimum pitch along the translating axis.

5. The method of claim 1, wherein the fluid dispense ports have a fluid dispense port pitch, and the offset distance is a non-integer multiple of the fluid dispense port pitch.

6. The method of claim 1, wherein the first substrate fluid droplet pattern is different from the second substrate fluid dispense pattern.

7. The method of claim 1, wherein the formable material is dispensed using a same single-pass fluid droplet pattern for the first and second passes, wherein the first fluid droplet pattern is offset from the second substrate fluid droplet pattern.

8. The method of claim 1, wherein:
    the fluid dispense system dispenses fluid droplets in a column lying along a line, the fluid dispense system further configured to dispense the fluid droplets of the formable material at a preset frequency to achieve spaced-apart droplets on a substrate at a preset minimum pitch as the substrate and the fluid dispense ports move relative to each other at a preset speed along the translating axis;
    determining a preset-defined fluid droplet pattern for dispensing the formable material onto the substrate, the preset-defined fluid droplet pattern based on at least a pattern of an imprint lithography template, and wherein the preset-defined fluid droplet pattern is representative of fluid droplets spaced apart on the substrate at the preset minimum pitch or an integer multiple thereof as the substrate and the fluid dispense ports are moved relative to each other at the preset speed along the transverse axis;
    determining an adjusted fluid droplet pattern based on the preset-defined fluid droplet pattern, wherein the adjusted fluid droplet pattern is representative of fluid droplets spaced apart at a non-integer multiple of the preset minimum pitch;
    determining an adjusted speed of the substrate and the fluid dispense ports relative to each other to generate the adjusted fluid droplet pattern formed during the first and second passes, wherein the adjusted speed is different than the preset speed during the first pass, the second pass, or each of the first and second passes; and
    during the first pass, the second pass, or each of the first and second passes, moving the substrate and the fluid dispense ports relative to each other at the adjusted speed along the translating axis, and dispensing the formable material through the fluid dispense ports at the preset frequency.

9. The method of claim 1, wherein during the first and second passes, dispensing the formable material is performed such that centers of fluid droplets closest to the edges of the imprint field lie along X1, X2, Y1, and Y2 lines of a drop edge exclusion.

10. A method of manufacturing an article, the method comprising:
providing a fluid dispense system having fluid dispense ports;
during a first pass, dispensing a formable material onto a surface of a substrate by the fluid dispense system having fluid dispense ports to form a first substrate fluid droplet pattern for a first part of an imprint field of the substrate, wherein the substrate and the fluid dispense ports move relative to each other along a translating axis;
offsetting the fluid dispense ports and substrate relative to each other after dispensing the formable material during the first pass;
during a second pass, dispensing the formable material onto the surface of the substrate by the fluid dispense system to form a second substrate fluid droplet pattern for a second part of the imprint field, wherein offsetting the fluid dispense ports and substrate relative to each other is performed between the first pass and the second pass,
wherein:
the first substrate fluid droplet pattern has fluid droplets of the formable material lying along a plurality of lines, wherein lines of the plurality of lines are spaced apart from one another at a pitch in a y-direction, and
offsetting is along a plane parallel to the surface of the substrate in a direction of the pitch for an offset distance that is a non-integer multiple of the pitch;
contacting the formable material with the template having a surface; and
curing the formable material to form a layer corresponding to the surface of the template.

11. The method of claim 10, wherein the article includes an electronic device, and the substrate includes a semiconductor wafer.

* * * * *